(12) United States Patent
Jeong et al.

(10) Patent No.: US 10,170,197 B2
(45) Date of Patent: Jan. 1, 2019

(54) SEMICONDUCTOR DEVICE AND OPERATING METHOD THEREOF

(71) Applicant: SK hynix Inc., Gyeonggi-do (KR)

(72) Inventors: Hyeong-Soo Jeong, Gyeonggi-do (KR); Jong-Ho Son, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/627,562

(22) Filed: Jun. 20, 2017

(65) Prior Publication Data

US 2018/0096731 A1    Apr. 5, 2018

(30) Foreign Application Priority Data

Sep. 30, 2016    (KR) .................. 10-2016-0126181

(51) Int. Cl.
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC .................................................. G11C 17/18
USPC ...................................................... 365/225.7
See application file for complete search history.

(56) References Cited

U.S. PATENT DOCUMENTS

| 8,681,528 | B2 * | 3/2014 | Wu | G11C 17/16 365/104 |
|---|---|---|---|---|
| 9,230,112 | B1 * | 1/2016 | Peterson | G06F 21/575 |
| 9,373,005 | B2 * | 6/2016 | Kang | G06F 21/71 |
| 2009/0296511 | A1 * | 12/2009 | Henry | G06F 9/30003 365/225.7 |
| 2010/0235617 | A1 * | 9/2010 | Chen, Jr. | G06F 11/1417 713/2 |
| 2013/0166853 | A1 * | 6/2013 | Chung | G11C 16/26 711/154 |

(Continued)

FOREIGN PATENT DOCUMENTS

| KR | 1020130134682 | 12/2013 |
|---|---|---|
| KR | 1020150093082 | 8/2015 |
| KR | 1020180065579 | 6/2018 |

*Primary Examiner* — Min Huang
(74) *Attorney, Agent, or Firm* — IP & T Group LLP

(57) ABSTRACT

A semiconductor device includes: first to $N^{th}$ non-volatile memory areas, each including a plurality of cells positioned at cross points between row lines and column lines; a storage circuit including a plurality of unit latches suitable for storing data transferred from the first to $N^{th}$ non-volatile memory areas; and an operation control circuit suitable for controlling setup information of first to $N^{th}$ operation modes to be programmed in the first to $N^{th}$ non-volatile memory areas, respectively, during a rupture mode, and controlling a data transferred from the first non-volatile memory area to be written in the unit latches and controlling a data transferred from one of the second to $N^{th}$ non-volatile memory areas to be over-written in the unit latches in response to an operation mode change request, during a boot-up mode.

20 Claims, 8 Drawing Sheets

(56) References Cited

U.S. PATENT DOCUMENTS

2014/0208136 A1* 7/2014 Rahardjo .................. G06F 1/26
            713/320
2017/0091458 A1* 3/2017 Gupta ..................... G06F 21/57

* cited by examiner

SEMICONDUCTOR DEVICE AND OPERATING METHOD THEREOF

CROSS-REFERENCE TO RELATED APPLICATIONS

The present application claims priority of Korean Patent Application No. 10-2016-0126181, filed on Sep. 30, 2016, which is incorporated herein by reference in its entirety.

BACKGROUND

1. Field

Exemplary embodiments of the present invention relate to a semiconductor designing technology, and more particularly, to a semiconductor device that transfers data from a non-volatile memory area to latch circuits, and a method for operating the semiconductor device.

2. Description of the Related Art

A semiconductor device uses a non-volatile memory to store information for diverse internal control operations such as setup information and repair information. A fuse is widely used as the non-volatile memory. A fuse is cut by a laser to store data. A fuse may be programmed in a wafer state. Once the wafer is mounted inside a package, it is impossible to program the fuse. An e-fuse is suggested to be programmed even after the packaging phase. An e-fuse stores a data by changing a resistance between a gate and a drain/source of a transistor.

Data of an e-fuse may be identified through a large-sized transistor of the e-fuse without performing a sensing operation, or through a small-sized transistor of the e-fuse and an amplifier for sensing the current flowing through the transistor. The two above mentioned schemes have a limitation in terms of an area, the former because the transistor forming the e-fuse has to be designed in a large size and the latter because each e-fuse has to be provided with the amplifier.

Recently, an array e-fuse is suggested to overcome the area limitation of an e-fuse. When e-fuses are realized in the form of an array, the e-fuses may share an amplifier for amplifying the data thereof thereby reducing a total area occupied for the e-fuses.

The array e-fuse is required to perform a boot-up operation of storing fuse data thereof into a latch circuit. Generally, the number of e-fuses of an array e-fuse corresponds to the number of unit latches included in the latch circuit, respectively. During the boot-up operation, the e-fuses of the array e-fuse transfer the fuse data to the latch circuit. After the boot-up operation is finished, the semiconductor device may set up the internal circuits based on the data stored in the latch circuit and perform a normal operation.

If a request for changing an operation mode is inputted from a controller, the semiconductor device may have to re-set up internal operation information (e.g., internal voltage trimming level information, bias information, frequency information, delay tuning information and the like) with a setup value corresponding to the requested operation mode. The semiconductor device may store an optimized setup value for each requested operation mode of the semiconductor device in the array e-fuse, and change the setup value according to the requested operation mode by using the stored setup value. However, since the number of the unit latches of the latch circuit for storing the fuse data that are transferred from the array e-fuse during the boot-up operation is increased, the total area occupied by the latch circuit is increased.

SUMMARY

Embodiments of the present invention are directed to a semiconductor device that includes a latch circuit for storing setup information for an operation mode transferred from a non-volatile memory area, and over-writes the setup information for a corresponding operation mode in the latch circuit whenever the operation mode is changed.

In accordance with an embodiment of the present invention, a semiconductor device includes: first to $N^{th}$ non-volatile memory areas, each including a plurality of cells positioned at cross points between row lines and column lines; a storage circuit including a plurality of unit latches suitable for storing data transferred from the first to $N^{th}$ non-volatile memory areas; and an operation control circuit suitable for controlling setup information of first to $N^{th}$ operation modes to be programmed in the first to $N^{th}$ non-volatile memory areas, respectively, during a rupture mode, and controlling a data transferred from the first non-volatile memory area to be written in the unit latches and controlling a data transferred from one of the second to $N^{th}$ non-volatile memory areas to be over-written in the unit latches in response to an operation mode change request, during a boot-up mode.

In accordance with another embodiment of the present invention, a semiconductor device includes: a non-volatile memory area including a first region having a plurality of cells programmed with setup information of a first operation mode and a second region having a plurality of cells programmed with setup information of a second operation mode; a storage circuit suitable for storing a data transferred from the first region or the second region; and an operation control circuit suitable for controlling the data transferred from the first region to be written in the storage circuit in response to a boot-up signal, and controlling the data transferred from the second region to be over-written in the storage circuit in response to a mode selection signal.

In accordance with yet another embodiment of the present invention, an operating method of a semiconductor device includes: providing first to Nth non-volatile memory areas, each including a plurality of cells positioned at cross points between row lines and column lines and a storage circuit including a plurality of unit latches suitable for storing data transferred from the first to Nth non-volatile memory areas; programming setup information of first to Nth operation modes in the plurality of cells of the first to Nth non-volatile memory areas, respectively, during a rupture mode; writing a data transferred from the first non-volatile memory area in the unit latches during a boot-up mode; and over-writing a data transferred from one among the second to Nth non-volatile memory areas in the unit latches in response to an operation mode change request.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Figure 1:
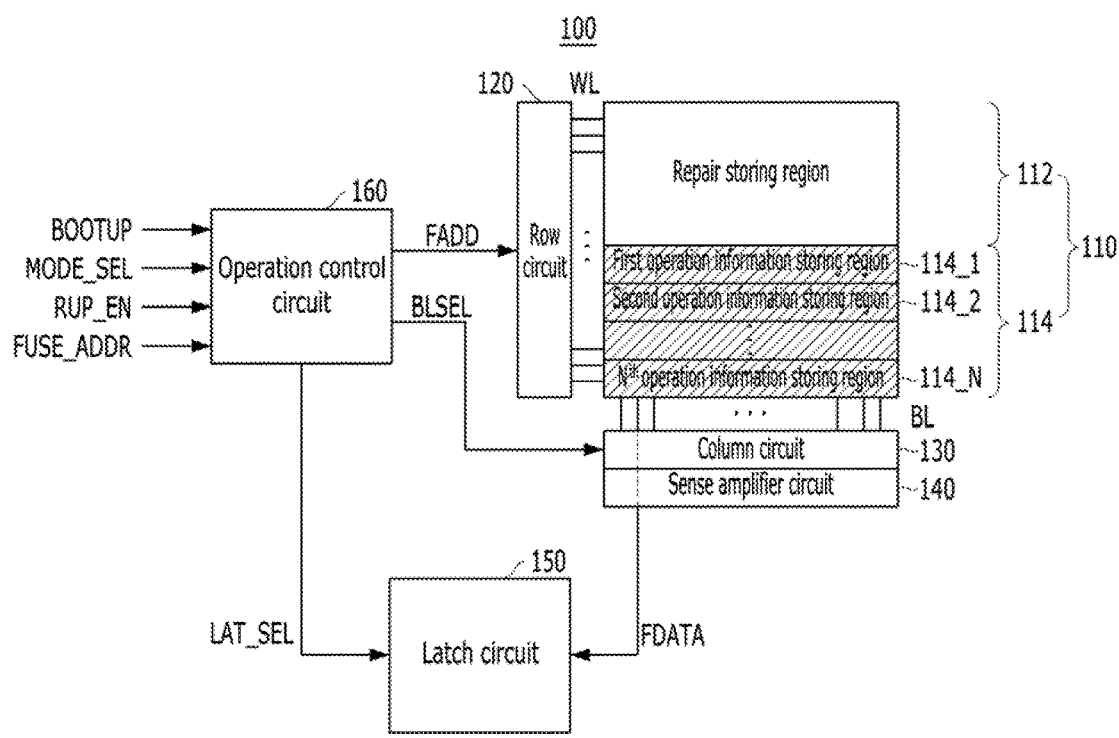
FIG. 1 is a block diagram illustrating a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, b, and C.

Spatially relative terms, such as "under," "below," "lower," "above," "upper" and the like may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprising," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a semiconductor device 100 in accordance with an embodiment of the present invention.

Referring to FIG. 1 the semiconductor device 100 may include a non-volatile memory area 110, a row circuit 120, a column circuit 130, a sense amplifier circuit 140, a latch circuit 150, and an operation control circuit 160.

The non-volatile memory area 110 may be one selected from a group including an array e-fuse circuit, a NAND flash memory, a NOR flash memory, an Erasable Programmable Read Only Memory (EPROM), a Ferroelectric Random Access Memory (FRAM), and a Magnetic Random Access Memory (MRAM). Hereafter, for the sake of convenience in description of the embodiment of the present invention, it is assumed that the non-volatile memory area 110 is formed of an array e-fuse circuit. Herein, the non-volatile memory area 110 may include a plurality of fuse cells (not shown) that are positioned at the cross points between row lines WL and column lines BL. According to the embodiment of the present invention, the non-volatile memory area 110 may include a repair storing region 112 for storing repair information and an operation information storing region 114 for storing information on first to $N^{th}$ operation modes. Meanwhile, although FIG. 1 shows a case where the non-volatile memory area 110 includes the repair storing region 112 and the operation information storing region 114, the spirit and concept of the embodiment of the present invention are not limited to it. In other words, the non-volatile memory area 110 may further include a region for storing additionally required information, such as weak cell information.

The operation information storing region 114 may include first to $N^{th}$ operation information storing regions 114_1 to 114_N for storing information on first to $N^{th}$ operation modes. The first to $N^{th}$ operation modes may include a low-power mode, a test mode, a low frequency mode and so forth. Different internal operation information (such as internal voltage trimming level information, bias information, frequency information, delay tuning information and so forth) may be set up according to the operation modes. Therefore, setup values of the internal operation information according to the first to $N^{th}$ operation modes (hereafter, referred to as 'setup information of the first to $N^{th}$ operation modes') may be programmed in the fuse cells included in each of the first to $N^{th}$ operation information storing regions 114_1 to 114_N.

Hereafter, in order to focus on the point of the present invention, description on the constituent elements related to the repair storing region 112 will be omitted, and the constituent elements related to the operation information storing region 114 will be described.

The latch circuit 150 may store fuse data FDATA that are transferred from the first to $N^{th}$ operation information storing regions 114_1 to 114_N. Herein, the fuse data FDATA may correspond to the setup information of the first to $N^{th}$ operation modes. The latch circuit 150 may include a plurality of unit latches (not shown). The plurality of unit latches may respectively correspond to the fuse cells included in the non-volatile memory area 110, meaning that for every fuse cell may correspond a unit latch. According to an embodiment of the present invention, the number of the unit latches may be smaller than the number of the fuse cells that are included in the non-volatile memory area 110.

The operation control circuit 160 may control the setup information of the first to $N^{th}$ operation modes to be programmed in the first to $N^{th}$ operation information storing regions 114_1 to 114_N, respectively, based on a fuse address FUSE_ADDR inputted from the outside during a rupture mode. During a boot-up mode, the operation control circuit 160 may control the fuse data FDATA that is programmed in the first operation information storing region 114_1 to be written in the unit latches of the latch circuit 150, and in response to an operation mode change request, the operation control circuit 160 may control the fuse data FDATA that is programmed in one among the second to $N^{th}$ operation information storing regions 114_2 to 114_N to be over-written in the unit latches of the latch circuit 150.

Meanwhile, although the case where the fuse data FDATA that is programmed in the first operation information storing region 114_1 is written in the latch circuit 150 first during the boot-up mode for the sake of convenience in description, the concept and spirit of the embodiment of the present invention are not limited to this case. In other words, the operation control circuit 160 may control the use data FDATA that is programmed in one among the first to $N^{th}$ operation information storing regions 114_1 to 114_N to be written in the latch circuit 150 first during the boot-up mode, and in response to the operation mode change request, the operation control circuit 160 may control the fuse data FDATA that is programmed in another one among the first to $N^{th}$ operation information storing regions 114_1 to 114_N to be over-written in the unit latches of the latch circuit 150.

When a rupture mode signal RUP_EN is enabled, the operation control circuit 160 may generate a row address FADD and a column selection signal BLSEL based on the fuse address FUSE_ADDR inputted from the outside, and perform a rupture operation to program the setup information of the first to $N^{th}$ operation modes in the first to $N^{th}$ operation information storing regions 114_1 to 114_, respectively.

When a boot-up signal BOOTUP is enabled, the operation control circuit 160 may generate the row address FADD and the column selection signal BLSEL for selecting the fuse cells disposed in the first operation information storing region 114_1 and generate a latch selection signal LAT_SEL for sequentially selecting the unit latches of the latch circuit 150. Therefore, when the boot-up signal BOOTUP is enabled, the operation control circuit 160 may control the fuse data FDATA programmed in the first operation information storing region 114_1 to be written in the unit latches of the latch circuit 150.

Also, when a controller (not shown) sends the operation mode change request and the boot-up signal BOOTUP is enabled while a mode selection signal MODE_SEL is enabled, the operation control circuit 160 may generate the row address FADD and the column selection signal BLSEL for selecting the fuse cells disposed in one among the second to $N^{th}$ operation information storing regions 114_2 to 114_N, and generate the latch selection signal LAT_SEL for sequentially selecting the unit latches of the latch circuit 150. Herein, the operation control circuit 160 may generate the latch selection signal LAT_SEL for over-writing the fuse data FDATA transferred from the selected fuse cells in the unit latches storing the fuse data FDATA transferred from the first operation information storing region 114_1 during the boot-up mode. Therefore, when the mode selection signal MODE_SEL is enabled, the operation control circuit 160 may control the fuse data FDATA programmed in one among the second to $N^{th}$ operation information storing regions 114_2 to 114_N to be over-written in the unit latches of the latch circuit 150.

The row circuit 120 may enable a row line WL corresponding to the row address FADD. The column circuit 130 may select a column line BL corresponding to the column selection signal BLSEL. The sense amplifier circuit 140 may sense and amplify the data of a fuse cell coupled to a cross point between an enabled row line WL and a selected column line BL, and output the data as a fuse data FDATA. Therefore, the latch circuit 150 may sequentially enable the unit latches in response to the latch selection signal LAT_SEL and store the fuse data FDATA outputted from the sense amplifier circuit 140.

Generally the fuse cells included in the non-volatile memory area 110 may be matched to the unit latches included in the latch circuit 150 in one-on-one, and the fuse data FDATA programmed in the fuse cells may be stored in the unit latches of the latch circuit 150 in one-on-one during the boot-up mode.

However, in this embodiment of the present invention, the fuse cells of each of the first to $N^{th}$ operation information storing regions 114_1 to 114_N that are coupled to the same column line BL may correspond to each other, and the corresponding fuse cells of each of the first to $N^{th}$ operation information storing regions 114_1 to 114_N that are coupled to the same column line BL may be designed to share a unit latch. Thus, the number of the unit latches of the latch circuit 150 may be smaller than the number of the fuse cells included in the latch circuit 150 included in the non-volatile memory area 110.

Therefore, it is possible to make the fuse data FDATA programmed in the first operation information storing region 114_1 to be written in the shared unit latches of the latch circuit 150 during the boot-up mode, and to make the fuse data FDATA programmed in one among the first to $N^{th}$ operation information storing regions 114_1 to 114_N to be over-written in the shared unit latches of the latch circuit 150 in response to the operation mode change request. In short, since the setup information of the current operation mode are over-written over the setup information of the previous operation mode whenever the operation mode is changed, it does not have to include the same number of unit latches as the fuse cells of the first to $N^{th}$ operation information storing regions 114_1 to 114_N, but include as many unit latches as are the fuse cells included in one among the first to $N^{th}$ operation information storing regions 114_1 to 114_N. Consequently, the number of the unit latches may be decreased, minimizing the area occupied by the latch circuit 150.

Hereafter, the entire structure of the embodiment of the present invention is described with reference to the accompanying drawing.

Figure 2:
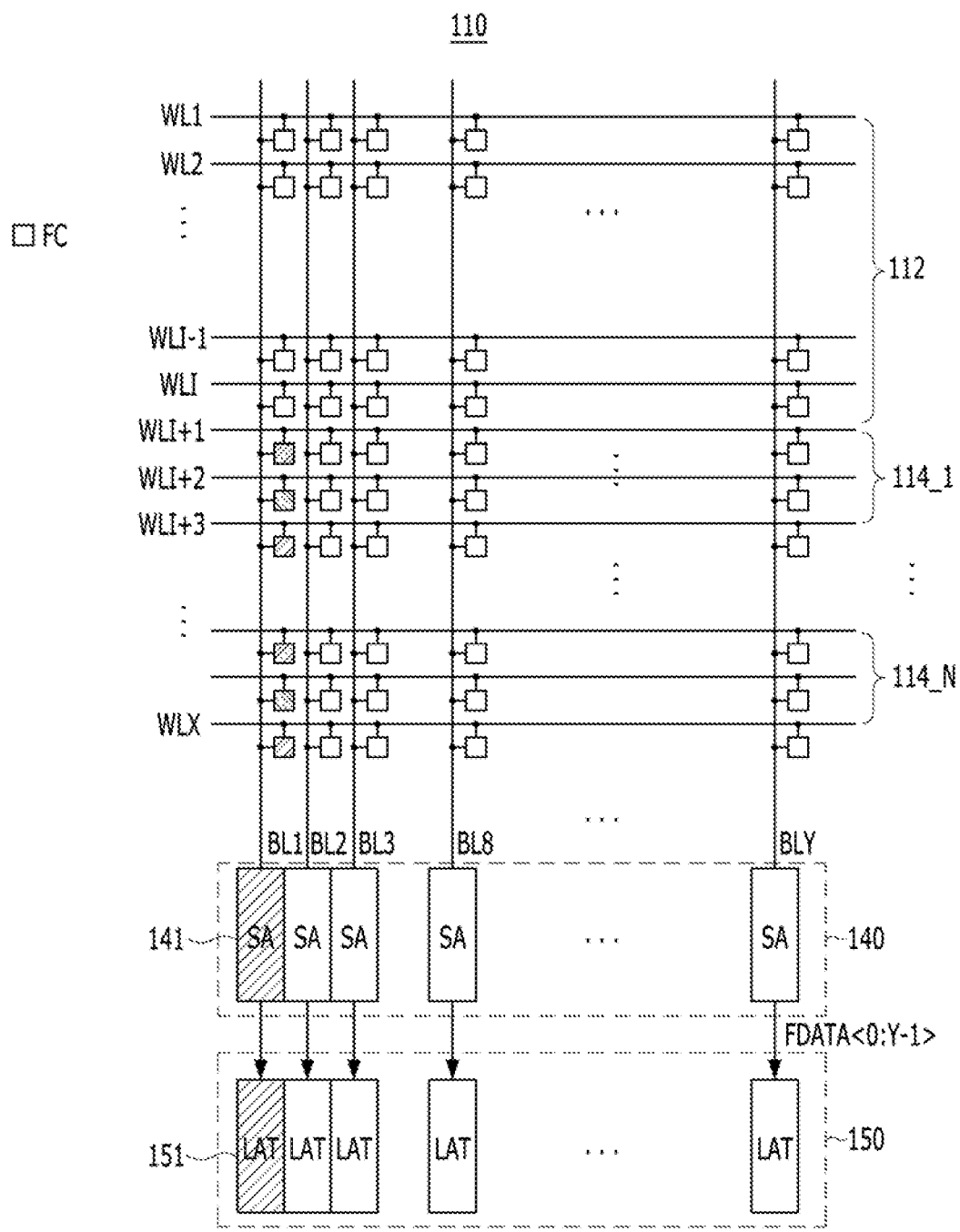
FIG. 2 is a block diagram illustrating a connection between a latch circuit and a non-volatile memory area shown in FIG. 1.

FIG. 2 is a block diagram illustrating a connection between the latch circuit 150 and the non-volatile memory area 110 shown in FIG. 1.

Referring to FIG. 2, the non-volatile memory area 110 may include a plurality of fuse cells FC disposed at the cross points between X row lines WL1 to WLX and Y column lines BL1 to BLY. The non-volatile memory area 110 may include the repair storing region 112 and an operation information storing region 114 for storing the information of the first to $N^{th}$ operation modes. The operation information storing region 114 may include the first to $N^{th}$ operation information storing regions 114_1 to 114_N.

The sense amplifier circuit 140 may include a plurality of sense-amplifiers SA s that respectively correspond to the Y column lines BL1 to BLY, i.e., one sense-amplifier SA for each column line. The latch circuit 150 may include a plurality of latches LATs that respectively correspond to the sense-amplifiers SAs, i.e., one latch circuit for each sense-amplifier SA.

Hereafter, it is assumed for the sake of convenience in description that the repair storing region 112 includes I numbers of the row lines WL1 to WLI, and each of the first to $N^{th}$ operation information storing regions 114_1 to 114_N includes three row lines WL. For example, the first operation information storing region 114_1 may include three row lines WLI+1 to WLI+3.

Figure 3:
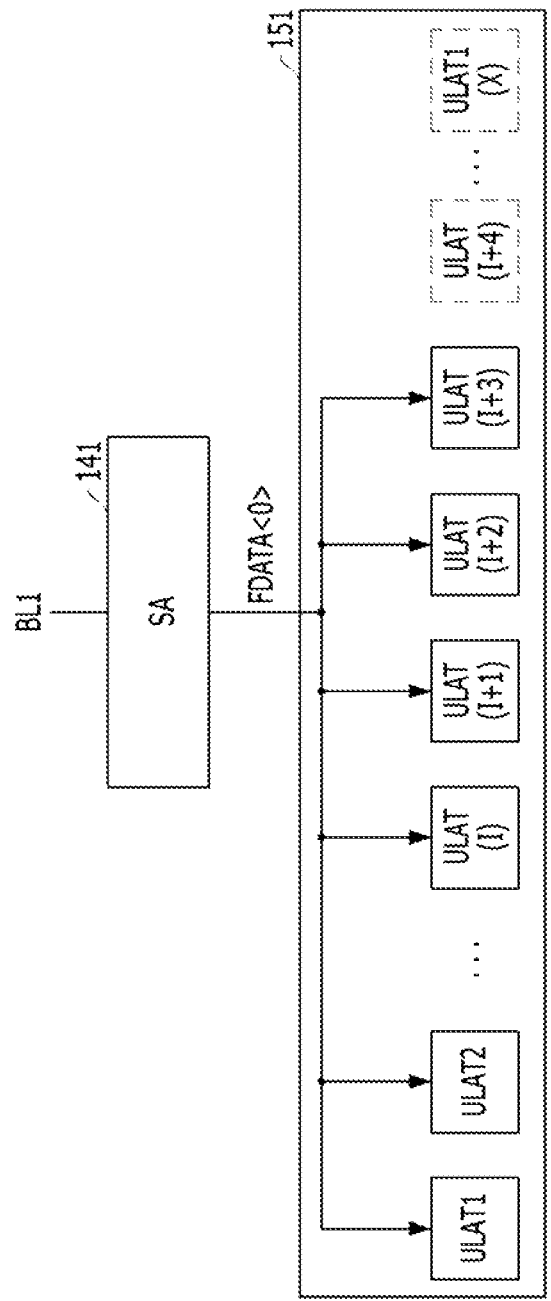
FIG. 3 is a block diagram illustrating a connection between a sense amplifier and unit latches of a first latch shown in FIG. 2.

FIG. 3 is a block diagram illustrating a connection between a sense amplifier 141 and unit latches ULATs of a first latch 151 shown in FIG. 2.

Referring to FIG. 3, a coupling between a first sense amplifier 141 of the sense-amplifiers SAs and a first latch 151 of the latches LATs is shown.

The first sense amplifier 141 may sense and amplify a data of a fuse cell that is transferred through a first column line BL1 and output the sensed and amplified data as a first fuse data FDATA<0>. The first latch 151 may store the first fuse data FDATA<0> outputted from the first sense amplifier 141.

There may be a plurality of unit latches ULAT1 to ULAT(I+3) in the first latch 151. The first latch 151 may include unit latches ULAT1 to ULAT(I) corresponding to the number of the fuse cells that are coupled to the I numbers of the row lines WL1 to WLI included in the repair storing region 112, and include unit latches ULAT(I+1) to ULAT (I+3) corresponding to the number of the fuse cells that are coupled to the 3 row lines WL included in one operation information storing region among the first to $N^{th}$ operation information storing regions 114_1 to 114_N. The fuse cells FC of the first to $N^{th}$ operation information storing regions 114_1 to 114_N that are coupled to the same column line BL may share the unit latches ULAT(I+1) to ULAT(I+3).

According to the prior art, each of the latches LAT is required to include X numbers of unit latches that correspond to the number of the fuse cells coupled to X numbers of row lines WL. On the other hand, in accordance with the embodiment of the present invention, each of the latches LAT may require a smaller number of the (I+3) unit latches than the X numbers. In short, whereas the conventional latch circuit has required X*Y numbers of unit latches that respectively correspond to the X*Y numbers of fuse cells that are included in the non-volatile memory area 110 in a one to one correspondence, the latch circuit 150 in accordance with the embodiment of the present invention may require a smaller number (i.e., (I+3)*Y numbers) of unit latches than the X*Y numbers of fuse cells. Consequently, the number of the unit latches may be decreased, thus minimizing the area occupied by the latch circuit 150.

Figure 4:
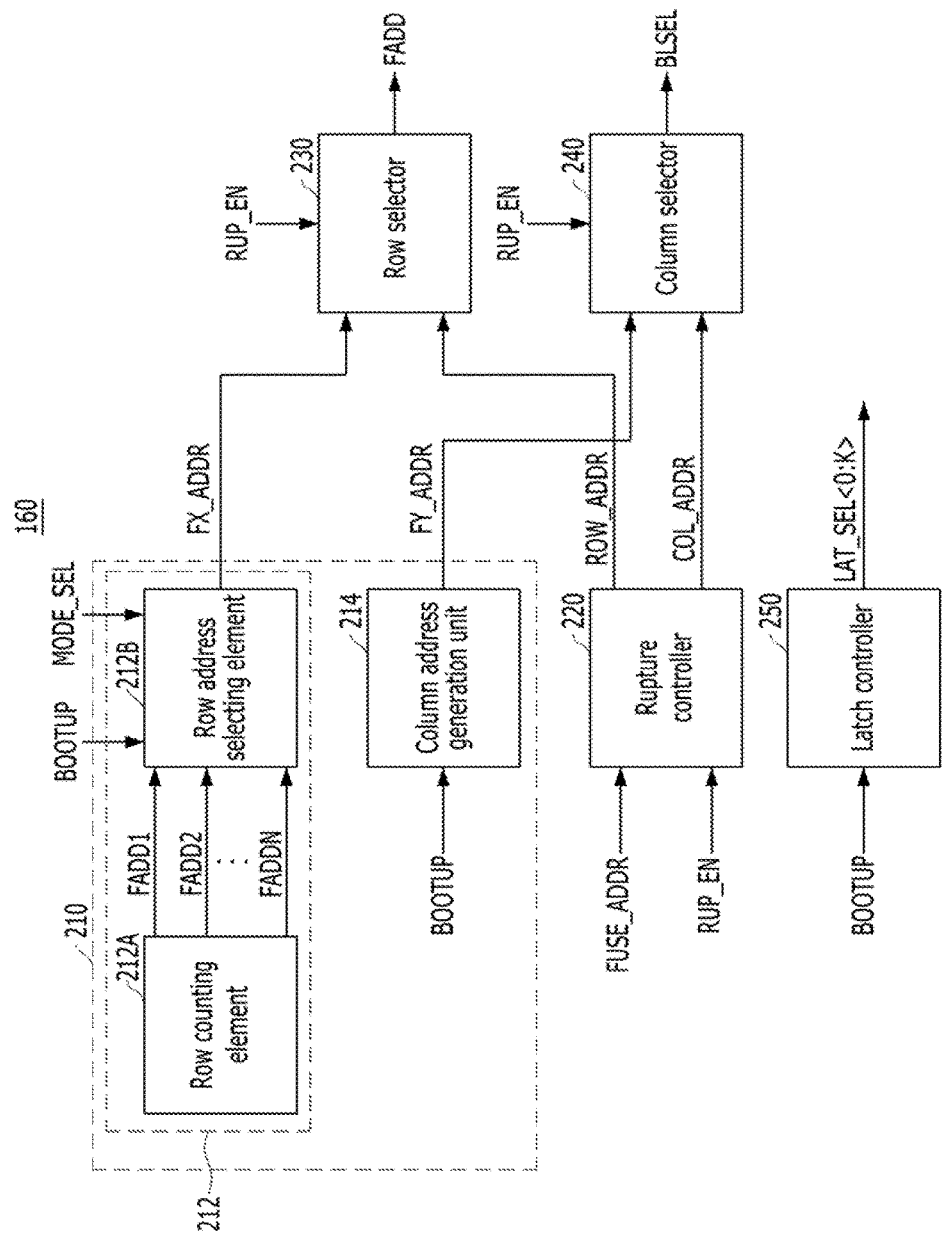
FIG. 4 is a detailed block diagram illustrating an operation control circuit shown in FIG. 1.

FIG. 4 is a detailed block diagram illustrating the operation control circuit 160 shown in FIG. 1.

Referring to FIG. 4, the operation control circuit 160 may include a boot-up controller 210, a rupture controller 220, and a latch controller 250.

The boot-up controller 210 may generate first to $N^{th}$ operation mode addresses FADD1 to FADDN, output the first operation mode address FADD1 in response to the boot-up signal BOOTUP, and select and output one among the second to $N^{th}$ operation mode addresses FADD2 to FADDN in response to the mode selection signal MODE_SEL.

Herein, the number of the bits of the mode selection signal MODE_SEL may depend on the number of the first to $N^{th}$ operation modes. Also, the mode selection signal MODE_SEL may include information on the operation mode change request and information on the setup of an operation mode. For example, to set up four operation modes, the mode selection signal MODE_SEL may be of three bits: one bit corresponding to the information on the operation mode change request and two bits corresponding to the information on the setup of the four operation modes. According to one embodiment of the present invention, the operation control circuit 160 may operate by separately receiving a mode change request signal including the information on the operation mode change request and the mode selection signal MODE_SEL including the information on the setup of an operation mode. Hereafter, an enablement of the mode selection signal MODE_SEL may represent an enablement of the one bit corresponding to the information on the operation mode change request.

To be specific, the boot-up controller 210 may include a row address generation unit 212 and a column address generation unit 214.

The row address generation unit 212 may include a row counting element 212A and a row address selecting element 212B. The row counting element 212A may generate the first to $N^{th}$ operation mode addresses FADD1 to FADDN by performing a counting operation. The row address selecting element 212B may select one among the first to $N^{th}$ operation mode addresses FADD1 to FADDN in response to the boot-up signal BOOTUP and the mode selection signal MODE_SEL and output the selected operation mode address as a row address FX_ADDR. When the boot-up signal BOOTUP is enabled during the boot-up mode, the row address selecting element 212B may select the first operation mode address FADD1. Also, when the operation mode change request is applied from the controller (not shown) and the boot-up signal BOOTUP is enabled while the mode selection signal MODE_SEL is enabled, the row address selecting element 212B may select one among the second to $N^{th}$ operation mode addresses FADD2 to FADDN according to the mode selection signal MODE_SEL. The column address generation unit 214 may output a column address FY_ADDR in response to the boot-up signal BOOTUP.

Herein, although only the row address generation unit 212 is described to generate the first to $N^{th}$ operation mode addresses FADD1 to FADDN, the scope and spirit of the present invention are not limited to it. For example, the column address generation unit 214 may include a counting element and a selecting element, and generate the first to $N^{th}$ operation mode addresses FADD1 to FADDN, select one among the first to $N^{th}$ operation mode addresses FADD1 to FADDN and output the selected operation mode address as a column address FY_ADDR.

When the rupture mode signal RUP_EN is enabled, the rupture controller 220 may generate a row address ROW_ADDR and a column address COL_ADDR based on a fuse address FUSE_ADDR inputted from the outside.

Also, the operation control circuit 160 may further include a row selector 230 and a column selector 240.

The row selector 230 may select one between the row address FX_ADDR outputted from the boot-up controller 210 and the row address ROW_ADDR outputted from the rupture controller 220 and output the selected row address as a row address FADD in response to the rupture mode signal RUP_EN. The column selector 240 may select one between the column address FY_ADDR outputted from the boot-up controller 210 and the column address COL_ADDR outputted from the rupture controller 220 and output the selected column address as the column selection signal BLSEL in response to the rupture mode signal RUP_EN.

The latch controller 250 may generate a latch selection signal LAT_SEL<0:K> for sequentially selecting multiple unit latches in response to the boot-up signal BOOTUP. According to another embodiment of the present invention, the number of the bits of the latch selection signal LAT_SEL<0:K> may correspond to the multiple unit latches (for example, (I+3)*Y numbers of the unit latches), respectively.

Figure 5:
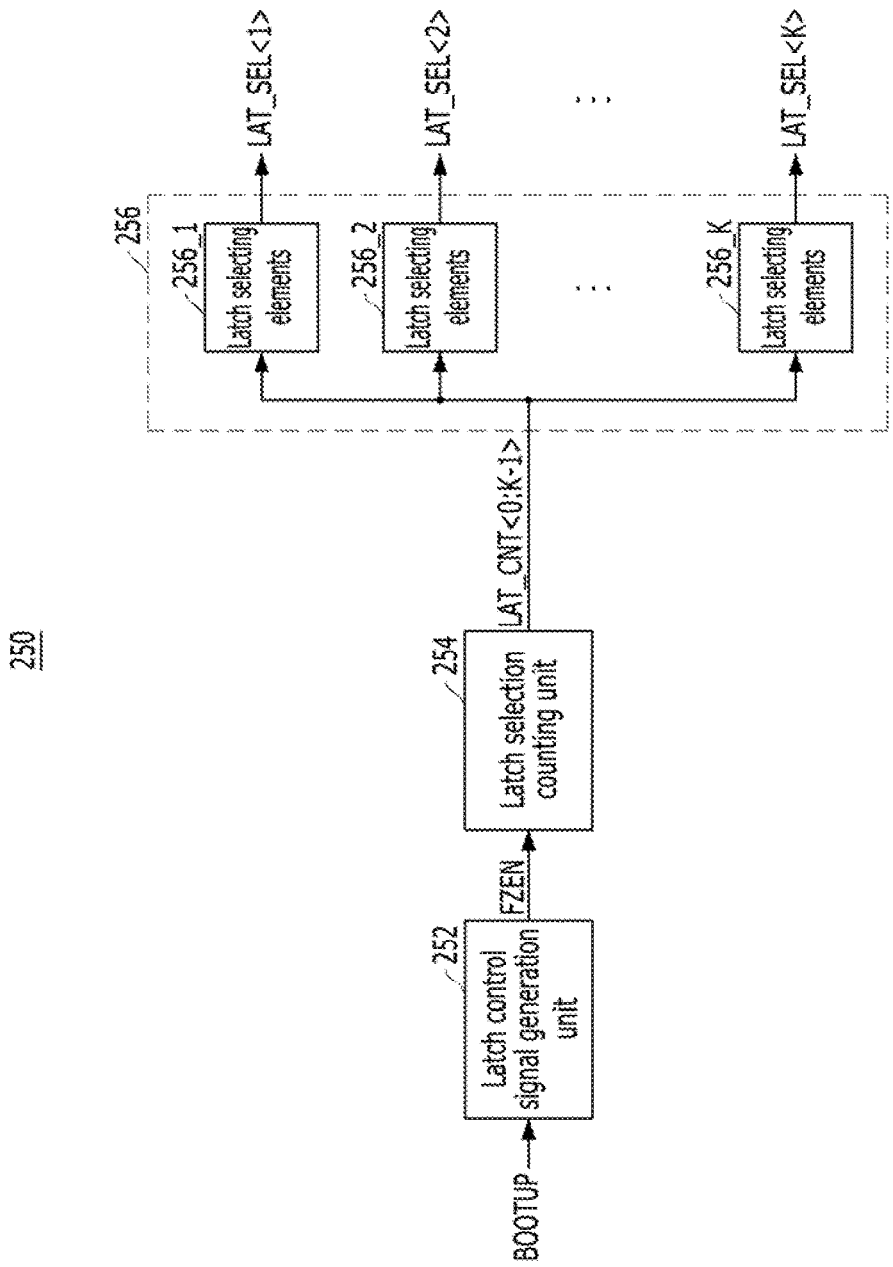
FIG. 5 is a detailed block diagram illustrating a latch controller shown in FIG. 4.

FIG. 5 is a detailed block diagram illustrating a latch controller 250 shown in FIG. 4.

Referring to FIG. 5, the latch controller 250 may include a latch control signal generation unit 252, a latch selection counting unit 254, and a latch selecting unit 256.

The latch control signal generation unit 252 may generate a latch control signal FZEN in response to the boot-up signal BOOTUP. When the boot-up signal BOOTUP is enabled, the latch control signal generation unit 252 may enable the latch control signal FZEN.

The latch selection counting unit 254 may generate a latch counting signal LAT_CNT<0:K−1> by performing a counting operation in response to the latch control signal FZEN.

The latch selecting unit 256 may generate the latch selection signal LAT_SEL<0:K> in response to the latch counting signal LAT_CNT<0:K−1>. The latch selecting unit 256 may include a plurality of latch selecting elements 256_1 to 256_K that receive the bits of the latch counting signal LAT_CNT<0:K−1> and output the latch selection signal LAT_SEL<0:K>. Therefore, when a particular bit of the latch counting signal LAT_CNT<0:K−1> is enabled, the latch selecting unit 256 may enable and output the corresponding latch selection signal LAT_SEL<0:K>.

Hereafter, the operations of the semiconductor device are described in accordance with the embodiment of the present invention by referring to the accompanying drawings.

Figure 6:
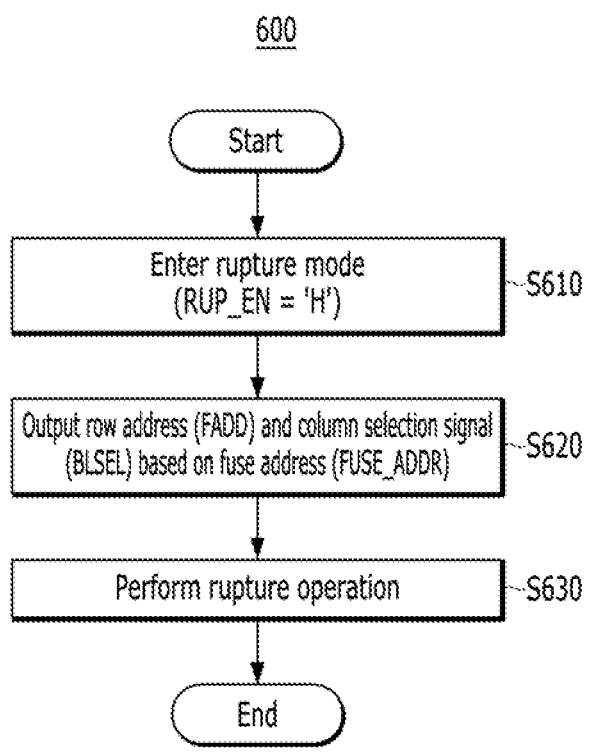
FIG. 6 is a flowchart illustrating a rupture operation of the semiconductor device in accordance with the embodiment of the present invention.

FIG. 6 is a flowchart illustrating a rupture operation 600 of the semiconductor device 100 in accordance with an embodiment of the present invention.

Referring to FIG. 6, when the rupture mode signal RUP_EN is enabled, the semiconductor device may enter a rupture mode in step S610.

When the rupture mode signal RUP_EN is enabled, the rupture controller 220 may generate the row address ROW_ADDR and the column address COL_ADR based on the fuse address FUSE_ADDR inputted from the outside. Also, in response to the enabled rupture mode signal RUP_EN, the row selector 230 may select the row address ROW_ADDR outputted from the rupture controller 220 and output the selected row address ROW_ADDR as the row address FADD, and the column selector 240 may select the column address COL_ADDR outputted from the rupture controller 220 and output the selected column address COL_ADDR as the column selection signal BLSEL in step S620.

In step S630, the row circuit 120 may enable a row line WL corresponding to the row address FADD, and the column circuit 130 may select a column line BL corresponding to the column selection signal BLSEL, and perform a rupture operation of programming the setup information of the first to $N^{th}$ operation modes in the first to $N^{th}$ operation information storing regions 114_1 to 114_N, respectively.

Figure 7:
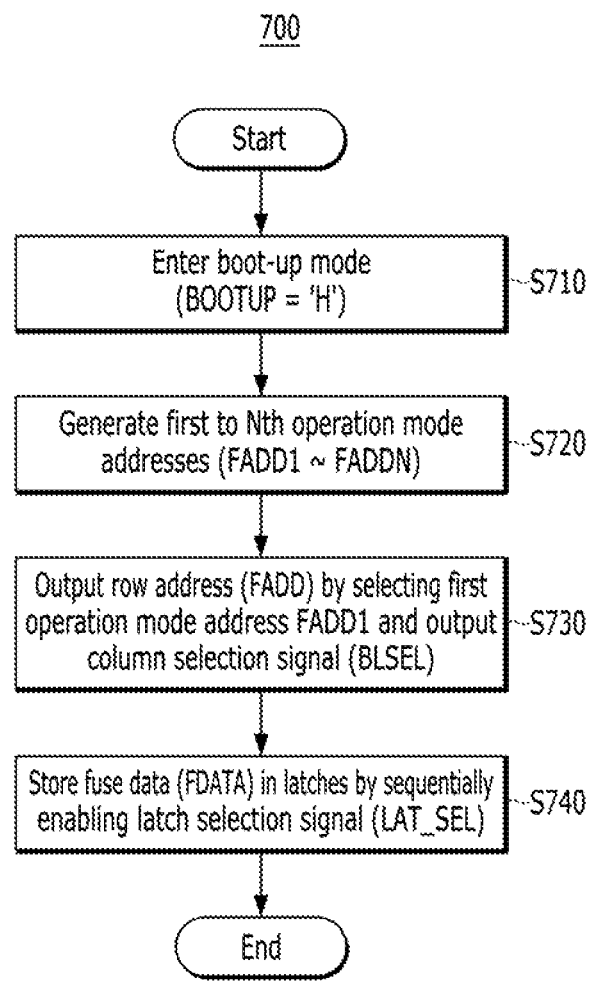
FIG. 7 is a flowchart illustrating a boot-up operation of the semiconductor device in accordance with the embodiment of the present invention.

FIG. 7 is a flowchart illustrating a boot-up operation 700 of the semiconductor device 100 in accordance with an embodiment of the present invention.

Referring to FIG. 7, when the boot-up signal BOOTUP is enabled, the semiconductor device may enter the boot-up mode in step S710.

In step S720, the row address generation unit 212 of the boot-up controller 210 may generate the first to $N^{th}$ operation mode addresses FADD1 to FADDN by performing a counting operation.

When the boot-up signal BOOTUP is enabled, the row address generation unit 212 may select the first operation mode address FADD1 and output the selected first operation mode address FADD1 as the row address FX_ADDR, and the column address generation unit 214 may output the column address FY_ADDR. Also, in response to the disabled rupture mode signal RUP_EN, the row selector 230 may select the row address FX_ADDR outputted from the boot-up controller 210 and output the selected row address FX_ADDR as the row address FADD, and the column selector 240 may select the column address FY_ADD outputted from the boot-up controller 210 and output the selected column address FY_ADDR as the column selection signal BLSEL in step S730.

Also, the latch controller 250 may enable the latch selection signal LAT_SEL<0:K> for sequentially selecting the multiple unit latches in response to the boot-up signal BOOTUP. The row circuit 120 may enable a row line WL corresponding to the row address FADD, and the column circuit 130 may perform a boot-up operation of selecting a fuse cell of the first operation information storing region 114_1 by selecting a column line BL corresponding to the column selection signal BLSEL, and sequentially writing the fuse data FDATA transferred from the selected fuse cell in a unit latch that is selected based on the latch selection signal LAT_SEL<0:K> in step S740.

Figure 8:
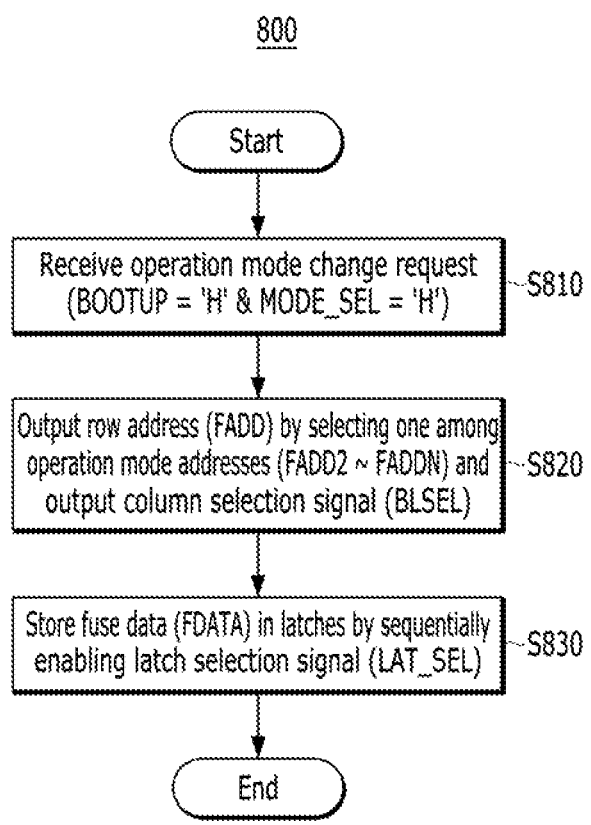
FIG. 8 is a flowchart illustrating a mode change operation of the semiconductor device in accordance with the embodiment of the present invention.

FIG. 8 is a flowchart illustrating a mode change operation 800 of the semiconductor device 100 in accordance with an embodiment of the present invention.

Referring to FIG. 8, when the operation mode change request is received from the controller (not shown), the boot-up signal BOOTUP may be enabled while the mode selection signal MODE_SEL is enabled in step S810.

When the mode selection signal MODE_SEL and the boot-up signal BOOTUP are enabled, the row address generation unit 212 may select one among the second $N^{th}$ to operation mode addresses FADD2 to FADDN based on the mode selection signal MODE_SEL, and output the selected operation mode address as the row address FX_ADDR, and the column address generation unit 214 may output the column address FY_ADDR. Also, the row selector 230 may select the row address FX_ADDR outputted from the boot-up controller 210 and output the selected row address FX_ADDR as the row address FADD, and the column selector 240 may select the column address FY_ADDR outputted from the boot-up controller 210 and output the selected column address FY_ADDR as the column selection signal BLSEL in response to the disabled rupture mode signal RUP_EN in step S828.

Also, the latch controller 250 may enable the latch selection signal LAT_SEL<0:K> for sequentially selecting the unit latches in response to the boot-up signal BOOTUP. The row circuit 120 may enable a row line WL corresponding to the row address FADD, and the column circuit 130 may select a fuse cell of one operation information storing region among the second to $N^{th}$ operation information storing regions 114_2 to 114_N by selecting a column line BL corresponding to the column selection signal BLSEL, and perform an over-write operation of sequentially over-writing the fuse data FDATA transferred from the selected fuse cell in the selected unit latch based on the latch selection signal LAT_SEL<0:K> in step S830.

According to an embodiment of the present invention, a semiconductor device includes a latch circuit for storing setup information of an operation mode transferred from a non-volatile memory area, and over-writes current setup information of a change-requested operation mode in the latch circuit whenever the operation mode is changed, thus reducing the number of the unit latches of the latch circuit and minimizing the area occupied by the latch circuit.

While the present invention has been described with respect to the specific embodiments, it will be apparent to those skilled in the art that various changes and modifications may be made without departing from the spirit and scope of the invention as defined in the following claims.

For example, the logical gates and transistors described in the above-described embodiments of the present invention may be realized in different positions and kinds according to the polarity of the inputted signals.

What is claimed is:

1. A semiconductor device comprising:
    first to $N^{th}$ non-volatile memory areas, each including a plurality of cells positioned at cross points between row lines and column lines;
    a storage circuit including a plurality of unit latches suitable for storing data transferred from the first to $N^{th}$ non-volatile memory areas, wherein the number of the plurality of unit latches corresponds to the number of the plurality of cells that are included in one of the first to $N^{th}$ non-volatile memory areas; and
    an operation control circuit suitable for controlling setup information of first to $N^{th}$ operation modes to be programmed in the first to $N^{th}$ non-volatile memory areas, respectively, during a rupture mode, and controlling a data transferred from the first non-volatile memory area to be written in the unit latches and controlling a data transferred from one of the second to $N^{th}$ non-volatile memory areas to be over-written in the unit latches in response to an operation mode change request, during a boot-up mode.

2. The semiconductor device of claim 1, wherein the number of the plurality of unit latches is smaller than the number of the plurality of cells included in all of the first to $N^{th}$ non-volatile memory areas.

3. The semiconductor device of claim 1, wherein cells of the first to $N^{th}$ non-volatile memory areas coupled to the same column line correspond to each other, and the corresponding cells share the unit latches.

4. The semiconductor device of claim 1, wherein the operation control circuit includes:
    a boot-up controller suitable for generating first to $N^{th}$ operation mode addresses, outputting the first operation mode address in response to a boot-up signal, and selecting and outputting one of the second to $N^{th}$ operation mode addresses in response to a mode selection signal;
    a rupture controller suitable for, when a rupture mode signal is enabled, receiving an external address and generating a row address and a column address for selecting one from the first to $N^{th}$ non-volatile memory areas; and
    a latch controller suitable for generating a latch selection signal for sequentially selecting the unit latches in response to the boot-up signal.

5. The semiconductor device of claim 4, wherein the boot-up controller includes:
    a row counting unit suitable for generating the first to $N^{th}$ operation mode addresses by performing a counting operation;
    a row address selecting unit suitable for selecting one from the first to $N^{th}$ operation mode addresses and outputting the selected operation mode address as the row address in response to the boot-up signal and the mode selection signal; and
    a column address generation unit suitable for outputting the column address in response to the boot-up signal.

6. The semiconductor device of claim 5, further comprising:
    a row circuit suitable for enabling a row line of the first to $N^{th}$ non-volatile memory areas corresponding to the row address;
    a column circuit suitable for selecting a column line of the first to $N^{th}$ non-volatile memory areas corresponding to the column address; and
    a sense amplifier circuit suitable for sensing and amplifying a data of a fuse cell that is coupled to a cross point between the enabled row line and the selected column line and outputting the amplified data as the data.

7. The semiconductor device of claim 4, wherein the latch controller includes:
    a latch control signal generation unit suitable for generating a latch control signal in response to the boot-up signal;
    a latch selection counting unit suitable for generating a latch counting signal by performing a counting operation in response to the latch control signal; and
    a latch selecting unit suitable for receiving each bit of the latch counting signal and enabling the latch selection signal.

8. A semiconductor device comprising:
a non-volatile memory area including a first region having a plurality of cells programmed with setup information of a first operation mode and a second region having a plurality of cells programmed with setup information of a second operation mode;
a storage circuit suitable for storing a data transferred from the first region or the second region, wherein the storage circuit includes a plurality of unit latches whose number corresponds to the number of the plurality of cells that are included in one of the first and second memory areas; and
an operation control circuit suitable for controlling the data transferred from the first region to be written in the storage circuit in response to a boot-up signal, and controlling the data transferred from the second region to be over-written in the storage circuit in response to a mode selection signal.

9. The semiconductor device of claim 8, wherein the operation control circuit controls the setup information of the first operation mode to be programmed in the first region, and controls the setup information of the second operation mode to be programmed in the second region based on an external address during a rupture mode.

10. The semiconductor device of claim 8, wherein
the number of the unit latches is smaller than the number of the plurality of cells included in the non-volatile memory area.

11. The semiconductor device of claim 10,
wherein the plurality of cells of the non-volatile memory area are positioned at cross points between column lines and row lines, and
wherein cells of the first and second regions coupled to the same column line share the plurality of unit latches.

12. The semiconductor device of claim 10, wherein the operation control circuit includes:
a boot-up controller suitable for generating a first address for a first operation mode and a second address for a second operation mode, outputting the first address in response to the boot-up signal, and outputting the second address in response to the mode selection signal; and
a latch controller suitable for generating a latch selection signal for sequentially selecting the unit latches in response to the boot-up signal.

13. The semiconductor device of claim 12, wherein the boot-up controller includes:
a row counting unit suitable for generating the first address and the second address by performing a counting operation;
a row address selecting unit suitable for selecting one of the first address and the second address, and outputting the selected address as a row address in response to the boot-up signal and the mode selection signal; and
a column address generation unit suitable for outputting a column address in response to the boot-up signal.

14. The semiconductor device of claim 13, further comprising:
a row circuit suitable for enabling a row line of the non-volatile memory area corresponding to the row address;
a column circuit suitable for selecting a column line of the non-volatile memory area corresponding to the column address; and
a sense amplifier circuit suitable for sensing and amplifying a data of a cell that is coupled to a cross point between the enabled row line and the selected column line and outputting the amplified data as the data.

15. The semiconductor device of claim 12, wherein the latch controller includes:
a latch control signal generation unit suitable for generating a latch control signal in response to the boot-up signal;
a latch selection counting unit suitable for generating a latch counting signal by performing a counting operation in response to the latch control signal; and
a latch selecting unit suitable for receiving each bit of the latch counting signal and enabling the latch selection signal.

16. An operating method of a semiconductor device, the operating method comprising:
providing first to $N^{th}$ non-volatile memory areas, each including a plurality of cells positioned at cross points between row lines and column lines and a storage circuit including a plurality of unit latches suitable for storing data transferred from the first to $N^{th}$ non-volatile memory areas, wherein the number of the plurality of unit latches corresponds to the number of the plurality of cells that are included in one of the first to $N^{th}$ non-volatile memory areas;
programming setup information of first to $N^{th}$ operation modes in the plurality of cells of the first to $N^{th}$ non-volatile memory areas, respectively, during a rupture mode;
writing a data transferred from the first non-volatile memory area in the unit latches during a boot-up mode; and
over-writing a data transferred from one among the second to $N^{th}$ non-volatile memory areas in the unit latches in response to an operation mode change request.

17. The operating method of claim 16, wherein cells of the first to $N^{th}$ non-volatile memory areas coupled to a single column line share the unit latches.

18. The operating method of claim 16, wherein the writing of the data transferred from the first non-volatile memory area in the unit latches during the boot-up mode includes:
generating first to $N^{th}$ operation mode addresses;
selecting and outputting the first operation mode address in response to the boot-up signal;
enabling a latch selection signal for selecting the unit latches in response to the boot-up signal; and
selecting a cell of the first non-volatile memory area corresponding to the first operation mode address, and sequentially writing a data transferred from the selected cell in the selected latch unit based on the latch selection signal.

19. The operating method of claim 18, wherein the enabling of the latch selection signal includes:
generating a latch control signal in response to the boot-up signal;
generating a latch counting signal by performing a counting operation in response to the latch control signal; and
receiving each bit of the latch counting signal and enabling the latch selection signal.

20. The operating method of claim 18, wherein the over-writing of the data includes:
selecting one from the second to $N^{th}$ operation mode addresses in response to a mode selection signal and outputting the selected operation mode address as a selection operation mode address;
enabling the latch selection signal for selecting the unit latches in response to the mode selection signal; and selecting a cell of the second to $N^{th}$ non-volatile memory areas corresponding to the selection operation mode address, and sequentially over-writing a data transferred from the selected cell in the selected unit latch based on the latch selection signal.

* * * * *